(12) United States Patent
Gebhardt et al.

(10) Patent No.: US 12,298,369 B2
(45) Date of Patent: May 13, 2025

(54) DEDICATED MAGNETIC RESONANCE DEVICE

(71) Applicant: Siemens Healthcare GmbH, Erlangen (DE)

(72) Inventors: Matthias Gebhardt, Erlangen (DE); Axel vom Endt, Erlangen (DE)

(73) Assignee: Siemens Healthineers AG, Erlangen (DE)

( * ) Notice: Subject to any disclaimer, the term of this patent is extended or adjusted under 35 U.S.C. 154(b) by 82 days.

(21) Appl. No.: 18/109,948

(22) Filed: Feb. 15, 2023

(65) Prior Publication Data
US 2023/0258752 A1 Aug. 17, 2023

(30) Foreign Application Priority Data
Feb. 16, 2022 (EP) .................................... 22156921

(51) Int. Cl.
| | | |
|---|---|---|
| *G01V 3/00* | (2006.01) | |
| *G01R 33/383* | (2006.01) | |
| *G01R 33/385* | (2006.01) | |
| *G01R 33/54* | (2006.01) | |

(52) U.S. Cl.
CPC ......... *G01R 33/383* (2013.01); *G01R 33/385* (2013.01); *G01R 33/543* (2013.01)

(58) Field of Classification Search
CPC ... G01R 33/383; G01R 33/385; G01R 33/543
USPC ...................................................... 324/307
See application file for complete search history.

(56) References Cited

U.S. PATENT DOCUMENTS

| | | |
|---|---|---|
| 11,204,405 B1 | 12/2021 | McDowell |
| 2003/0006771 A1 | 1/2003 | Goto et al. |
| 2014/0218033 A1* | 8/2014 | Ryu ................. G01R 33/34046 324/322 |
| 2016/0025826 A1 | 1/2016 | Taicher |
| 2017/0307704 A1* | 10/2017 | Leussler ............ G01R 33/3453 |
| 2018/0299520 A1* | 10/2018 | Piron ..................... A61B 5/055 |
| 2020/0309877 A1 | 10/2020 | Vester et al. |

FOREIGN PATENT DOCUMENTS

| | | | | |
|---|---|---|---|---|
| DE | 112015006697 T5 * | 3/2018 | ............. A61B 5/055 |
| EP | 228154 A * | 7/1987 | .......... G01R 33/383 |
| EP | 0237323 A2 | 9/1987 | |
| EP | 3711949 A1 * | 9/2020 | |
| WO | WO-2017015764 A1 * | 2/2017 | .......... B25J 19/0008 |

* cited by examiner

*Primary Examiner* — Walter L Lindsay, Jr.
*Assistant Examiner* — Frederick Wenderoth
(74) *Attorney, Agent, or Firm* — Banner & Witcoff Ltd.

(57) ABSTRACT

A magnetic resonance device for acquiring magnetic resonance data of an object, the magnetic resonance device including a main magnet operable to provide a main magnetic field along at least one surface of the main magnet, wherein the main magnet comprises: a first magnet segment; a second magnet segment; and a cavity to accommodate the second magnet segment, wherein the second magnet segment is arranged in the cavity of the main magnet, and wherein the second magnet segment is variably positioned and/or oriented relative to the first magnet segment to adjust a magnetic field contribution of the second magnet segment to the main magnetic field.

16 Claims, 4 Drawing Sheets

DEDICATED MAGNETIC RESONANCE DEVICE

TECHNICAL FIELD

The disclosure relates to a magnetic resonance device for acquiring magnetic resonance data of an object.

BACKGROUND

An early detection of diseases, such as prostate cancer, can significantly improve the chances of a successful therapy and/or the chance of avoiding or minimizing possible post-treatment sequels and secondary disorders. For example, a common prostate cancer screening method is a targeted clinical test that measures a prostate specific antigen (PSA) level in the patient blood. This method is relatively cheap and may be carried out at the point-of-care (POC), such as a physician's office. However, the PSA results tend to have poor specificity and the PSA test will usually not find all prostate cancers.

Hence, in order to detect clinically significant prostate cancers, additional medical examinations are required. For example, tissue biopsies guided by either ultrasound or magnetic resonance imaging are used. Ultrasound guided biopsy is relatively cheap and commonly available. However, ultrasound tissue contrasts are typically poor and there tends to be a high risk of missing prostate tumors. Magnetic resonance imaging, on the other hand, typically provides much better contrasts and is more reliable and precise.

Some prior art solutions have attempted to provide nuclear magnetic resonance (NMR) measurements at the POC by trying to squeeze the hardware of a full body magnetic resonance (MR) scanner into a more compact solution. However, this poses new problems, since state-of-the-art magnetic resonance imaging (MRI) techniques require high-field magnets to achieve good signal-to-noise ratio, strong gradient coils, used e. g. for diffusion-weighted contrast, as well as a highly homogeneous magnetic field and linear gradients across the field-of-view (FOV) to avoid image artefacts. All these requirements increase the costs and complexity, as well as the installation footprint (e. g. due to large stray magnetic field of strong magnets), and increase the operational costs, e. g. due to power and cooling water demand. Consequently, these requirements prevent a wide deployment at POC of these otherwise very valuable medical devices. In summary, solutions according to the state of the art that include magnetic resonance imaging are expensive and tend not to be readily available at a POC office.

SUMMARY

It is therefore an object of the disclosure to provide a magnetic resonance device that is small in size, has low maintenance costs and can be readily supplied at a point-of-care.

The disclosed magnetic resonance device for acquiring magnetic resonance data of an object includes a main magnet configured for providing a main magnetic field along at least one surface of the main magnet. The main magnet comprises a first magnet segment, a second magnet segment and a cavity configured for accommodating the second magnet segment.

In one aspect, the magnetic resonance device is configured to acquire magnetic resonance data, particularly diagnostic magnetic resonance data, from an object positioned within an imaging region of the magnetic resonance device.

Preferably, the magnetic resonance device is configured to acquire diagnostic magnetic resonance data, particularly diagnostic magnetic resonance image data, from the object positioned within the imaging region. The object may be a patient, particularly a human or an animal. It is also conceivable that the object is a part of a patient, for example an organ or an organ structure.

The main magnet may comprise at least one permanent magnet, at least one electromagnet, and/or at least one superconducting magnet. In one aspect, the main magnet comprises at least two permanent magnets, at least two electromagnets, or at least two superconducting magnets. Preferably, the first magnet segment and the second magnet segment each consist of a permanent magnet, an electromagnet, or a superconducting magnet.

A permanent magnet may consist of a magnetic material, such as AlNiCo (aluminum-nickel-cobalt), NeFeB (neodymium-iron-boron) or SmCo (samarium-cobalt) alloys. Preferably, a permanent magnet comprises or consists of a ferromagnetic material. For example, the permanent magnet may comprise or consist of iron, cobalt, or nickel. It is also conceivable that the permanent magnet comprises or consists of an alloy of iron, cobalt and/or nickel. In a preferred aspect, the permanent magnet consists of iron or an iron alloy.

In one aspect, the main magnet may be composed of smaller, stacked permanent magnets or an array of permanent magnets. The array of permanent magnets may comprise a plurality of magnets with variable magnetic field strengths and/or magnetic orientations. Particularly, the array of permanent magnets may be configured as a Halbach array.

Permanent magnets may favourably provide a low-cost and/or space-saving solution for generating a magnetic field within the imaging volume. In providing a magnetic resonance device with permanent magnets, costs and space usually required for cooling equipment associated with superconducting magnets and electromagnets may favourably be reduced or avoided.

An electromagnet may be a non-superconducting magnet. Particularly, an electromagnet may comprise a resistive coil (e. g. an electrical conductor) wound around a magnetic core made of, for example, a ferromagnetic or ferrimagnetic material. An axial cross-section of the magnetic core may comprise a cylindrical shape, a cuboid shape, a prism shape or any other desirable shape. However, a magnetic core may also be omitted.

A superconducting magnet may comprise coils of superconducting wire and/or magnet segments of superconducting material. The superconductor may be a high temperature superconductor or a low temperature superconductor connected to a cryostat configured to keep a temperature of the superconductor below a predefined value. The superconducting wire may be encompassed by or embedded in an electrical conductor, such as copper, gold, silver and the like. However, the superconductor may also comprise one or more bulk magnet segments made from a superconducting material.

A low temperature superconductor may comprise superconducting properties at a temperature of about 4 K, whereas high temperature superconductors may comprise superconducting properties at temperatures in the range of 30 to 90 K. Examples of high temperature superconductors are barium copper oxides (e.g. YBCO, ReBCO), calcium copper oxides (e.g. BSCCO) as well as doped fullerides (e.g. $Cs_2RbC_{60}$), magnesium diboride and the like. Examples for low temperature superconducting materials are niobiumtitanium alloys, niobium-tin alloys as well as magnesium diborides. In using high temperature superconductors, an efficiency of a cryostat configured for cooling of the at least one magnet may favourably be increased in comparison to low temperature superconductors. In contrast, low temperature superconductors may be less expensive and easier to handle. By using a superconducting magnet, the magnetic field strength can favourably be increased in comparison to a permanent magnet or an electromagnet of comparable size.

Particularly, in case of an electromagnet or a superconducting magnet, the at least one surface directed towards the imaging volume of the main magnet may be characterized by a surface of a virtual envelope or a virtual envelope curve circumferentially enclosing the resistive coils or superconducting wires. Thus, the at least one surface of the main magnet may refer to a surface of a virtual envelope enclosing the electromagnet or superconducting magnet.

The at least one surface of the main magnet may represent a side of the main magnet oriented towards the imaging volume. The at least one surface may be configured to accommodate and/or support the object while a magnetic resonance measurement is performed.

The cavity may be formed as an indentation, a depression, a hole, a bore, an opening, or the like. Preferably, the cavity provides a volume or space within the main magnet. In one aspect, the cavity is formed within the first magnet segment.

A shape and/or a contour of an inner surface of the cavity may conform to a shape and/or a contour of an outer surface of the second magnet segment.

It is conceivable, that the shape of the cavity and the shape of the second magnet segment are matched in such a way to allow for a translational and/or rotational movement of the second magnet segment within the cavity. Particularly, the shape of the cavity and the shape of the second magnet segment are matched in such a way, to allow for rotational movement of the second magnet segment inside the cavity.

According to the disclosure, the second magnet segment is arranged in the cavity of the main magnet.

For example, the second magnet segment may be accommodated or embedded within the cavity of the main magnet, particularly within the cavity of the first magnet segment. It is conceivable, that the second magnet segment is encompassed by the main magnet and/or the first magnet segment in a circumferential direction when positioned within the cavity.

The cavity in the main magnet may pass through the first magnet segment from one side of the first magnet segment to an opposite side of the first magnet segment. It is also conceivable, that the cavity in the main magnet segment is open on one side of the first magnet segment but closed on the opposite side of the first magnet segment. Thus, the cavity may comprise a stop or an end stop inside main magnet or first magnet segment.

In a preferred aspect, the second magnet segment has a cylindrical and/or conical shape with an essentially circular cross-section. For example, a first section of the second magnet segment may be cylindrical in shape, whereas a second section of the second magnet segment may be conical in shape. However, the shape of the second magnet segment or a section of the second magnet segment may also correspond to a prism, a cube, or a cone. Preferably, the cavity of the main magnet is shaped in such a way to allow for a translational and/or rotational movement of the second magnet segment inside the cavity.

In a preferred aspect, the second magnet segment has a cylindrical shape and a diameter of 4 cm. However, the diameter of the second magnet segment may be smaller or larger than 4 cm. For example, the diameter of the second magnet segment may range between 1 and 10 cm.

In one aspect, the main magnet comprises a plurality of cavities and/or a plurality of magnet segments.

The second magnet segment may be configured to create a local change of a magnetic field of the main magnet. For example, the local change of the magnetic field of the main magnet may amount to 5% to 40%, preferably 10% to 20%. The local change of the magnetic field of the main magnet may be caused by moving and/or rotating the second magnet segment inside the cavity of the main magnet. An impact of such movement on the magnetic field of the main magnet may decrease with increasing distance between the second magnet segment and the at least one surface and a magnetic field provided via the first magnet segment may prevail over a magnetic field provided by the second magnet segment.

The second magnet segment is configured to be variably positioned and/or oriented relative to the first magnet segment to adjust a magnetic field contribution of the second magnet segment to the main magnetic field.

Preferably, the second magnet segment is configured to be variably positioned and/or oriented relative to the first magnet segment during a magnetic resonance measurement. Thus, a varying magnetic field contribution of the second magnet may be used for encoding of position-dependent information and/or diffusion information.

It is conceivable that the main magnet comprises the shape of a disk, a cuboid, a prism, or a kidney. For example, a prismatic shape may comprise a square or a polygonal cross-section. In one aspect, the cross-section of the main magnet is pentagonal or hexagonal. An overall appearance or form of the main magnet may be substantially flat, like a disk, or more elongated, like a cylinder or prism. In a preferred aspect, the cross-section of the main magnet is substantially circular.

The inventive magnetic resonance device may favourably provide time-variable, inhomogeneous magnetic fields which can be used for encoding of position-dependent information and/or diffusion information.

Furthermore, the inventive magnetic resonance device may favourably provide a low-cost and/or space-saving alternative to conventional magnetic resonance imaging modalities that may be used at a point-of-care. Particularly, the disclosed magnetic resonance device may be configured as a dedicated scanner configured for acquiring magnetic resonance data of predetermined regions of an object, such as extremities and/or specific organs of a patient.

According to an aspect of the inventive magnetic resonance device, an inner contour of the cavity of the main magnet essentially corresponds to an outer contour of the second magnet segment.

The cavity of the first magnet segment and the second magnet segment comprise a three-dimensional cylindrical or conical shape.

The inner contour of the cavity may be characterized by a two-dimensional and/or three-dimensional shape of the second magnet segment. The inner contour of the cavity may be defined by a shape of a cross-section of the cavity.

The outer contour of the second magnet segment may be characterized by a two-dimensional and/or three-dimensional shape of the second magnet segment or a shape of a cross-section of the second magnet segment.

A distance between an outer surface of the second magnet segment and an inner surface of the cavity may be less than 2 mm, less than 1 mm or preferably less than 0.5 mm. It is conceivable that the distance between the outer surface of the second magnet segment and the inner surface of the cavity varies minimally along a main direction of extension of the second magnet segment. For example, the local distance between the outer surface of the second magnet segment and the inner surface of the cavity may vary by less than 0.5 mm, less than 0.2 mm, or less than 0.1 mm.

In a preferred aspect, the cavity of the main magnet and the second magnet segment have complementary shapes. Particularly, the second magnet segment may exhibit a cylindrical or conical shape, whereas the cavity is formed as a corresponding cylindrical or conical recess.

In providing a minimal distance between the inner surface of the cavity and the outer surface of the second magnet segment, a magnetic field strength per unit volume of the main magnet may be favourably increased. Thus, the inventive magnetic resonance device may be particularly space efficient.

According to an aspect of the inventive magnetic resonance imaging device, a body of the second magnet segment is rotationally symmetric. For example, the second magnet segment may be shaped as a cylinder and/or a cone according to an aspect described above.

The second magnet segment comprises a ferromagnetic material, and a magnetization of the ferromagnetic material of the second magnet segment is oriented essentially perpendicular to an axis of rotational symmetry of the second magnet segment.

In one aspect, the second magnet segment may comprise or consist of a permanent magnet, particularly a ferromagnetic material. For example, a magnetization of the ferromagnet material of the second magnet segment is oriented essentially perpendicular with respect to the direction of the axis of rotational symmetry of the second magnet segment.

In other aspects, the second magnet segment may comprise or consist of an electromagnet or a superconducting magnet as according to an aspect described above. In this case, resistive wires or superconducting wires of the second magnet segment may be arranged in such a way to provide a magnetic field within the body of the second magnet segment which is oriented essentially perpendicular with respect to the direction of the axis of rotational symmetry of the second magnet segment.

A body of the second magnet segment may be characterized by a shape and/or volume encompassed by an imaginary envelope or envelope curve enclosing the second magnet segment, particularly resistive wires or superconducting wires of the second magnet segment. It is also conceivable that the body of the second magnet segment is defined by the shape of a permanent magnet, particularly an arrangement of ferromagnetic material, constituting the second magnet segment.

In providing a second magnet segment with a magnetic field direction oriented essentially perpendicular with respect to a direction of an axis of rotational symmetry of the second magnet segment, the magnetic field contribution of the second magnet segment to the main magnetic field may favourably be adjusted via rotation of the second magnet segment. Thus, an adjustment of the magnetic field contribution of the second magnet segment to the main magnetic field may favourably be facilitated.

According to an aspect of the inventive magnetic resonance device, the second magnet segment is rotatably mounted in the cavity of the main magnet in such a way, that an angular orientation of the second magnet segment is adjustable with respect to the first magnet segment.

In a first angular orientation of the second magnet segment, the direction of the magnetic field of the second magnet segment through the body of the second magnet segment is oriented in parallel to a direction of a magnetic field of the first magnet segment through a body of the first magnet.

In a second angular orientation of the second magnet segment, the direction of the magnetic field of the second magnet segment through the body of the second magnet segment differs from the direction of the magnetic field of the first magnet segment through the body of the first magnet segment.

As described above, the first magnet segment may comprise or consist of a permanent magnet, an electromagnet or a superconducting magnet. The body of the first magnet segment may be defined by the shape of a permanent magnet, particularly an arrangement of ferromagnetic material, constituting the first magnet segment. However, the body of the first magnet segment may also be characterized by a shape and/or volume encompassed by an imaginary envelope or envelope curve enclosing the first magnet segment.

In a preferred aspect, the first magnet segment and/or the second magnet segments comprise or consist of one or more permanent magnets and/or ferromagnets.

In a first angular orientation of the second magnet segment, a direction of magnetization of magnetic material of the second magnet segment may be oriented in parallel to a direction of magnetization of magnetic material in the first magnet segment. In a second angular orientation of the second magnet segment, the direction of magnetization of magnetic material of the second magnet segment may differ from the direction of magnetization of magnetic material of the first magnet segment.

The first angular orientation of the second magnet segment differs from the second angular orientation of the second magnet segment.

In providing a rotatably mounted second magnet segment, an efficiency and/or accuracy of adjusting the magnetic field contribution of the second magnet segment to the magnetic field of the main magnet may favourably be improved.

In one aspect of the inventive magnetic resonance device, the main magnet is configured as a single-sided magnet.

Preferably, the main magnet is configured to provide the main magnetic field along the at least one surface.

The term single-sided magnets may describe a magnet having a higher magnetic field strength on a first side and a weaker magnetic field strength or substantially no magnetic field on a second side opposite to the first side. For example, the second side of the main magnet may be covered with an iron sheet providing a shielding effect and/or deflecting the magnetic field in a direction towards the first side. Thus, the first side may exhibit a significantly increased magnetic field strength in comparison to the second side.

Preferably, a main direction of a magnetic field provided via the single-sided main magnet is oriented at an angle between 60° and 120°, particularly 90°, to the at least one surface.

The at least one surface may correspond to a surface of the first side of the single-sided main magnet having a stronger magnetic field in comparison to the second side.

In providing a single-sided main magnet, a strength of the magnetic field provided along the at least one surface may favourably be increased. Thus, a quality of magnetic resonance data, particularly magnetic resonance images, obtained from an object positioned on the at least one surface may favourably be improved in comparison to a regular (two-sided) magnet.

According to a further aspect of the inventive magnetic resonance device, the at least one surface of the main magnet comprises a recess. A contour of the recess is shaped in conformity with an outer contour of an imaging object.

A recess may be a depression, an indentation, a notch, a groove, a bend, or the like. In a preferred aspect, a shape or contour of the recess corresponds to a shape or contour of the object, particularly an anatomy of a patient. For example, the recess may be formed to accommodate a posterior region and/or an anterior region of a human patient. The recess may also be formed to accommodate an extremity of a patient.

In one aspect, a cross-section of the recess may comprise a U-shape, a V-shape, a C-shape, or the like.

In a preferred aspect, a contour of the recess is shaped in conformity with a contour of a body region of a patient. Thus, positioning and/or supporting a body region of a patient on the main magnet may be facilitated.

A recess may provide an increased distance between an imaging volume or field of view and the at least one surface. Thus, the inventive magnetic resonance device may favourably allow for an acquisition of magnetic resonance data of organ structures located deeper within a body of patient. It is also conceivable that a target region of the object is favourably positioned within a volume with higher magnetic field strength when the object is accommodated within the recess of the main magnet.

As a further advantage, a recess may favourably increase a comfort and/or support of a patient positioned on the at least one surface.

In one aspect of the magnetic resonance device, the main magnet comprises a second cavity and a third magnet segment. The third magnet segment is arranged in the second cavity and configured to be variably positioned and/or oriented relative to the first magnet segment for adjusting a magnetic field contribution of the third magnet segment to the main magnetic field.

The second cavity and/or the third magnet segment may be embodied according to an aspect of the cavity and/or the second magnet segment described above. Preferably, a main extension of the second cavity and the third magnet segment is smaller in comparison to a main extension of the cavity and the second magnet segment.

In one aspect, an intersection between the second cavity and the cavity is avoided.

In providing a second cavity and a third magnet segment configured to be variably positioned and/or oriented relative to the first magnet segment, position-dependent information and/or diffusion information may favourably be encoded in a position and/or orientation of the third magnet segment.

In a further aspect of the inventive magnetic resonance device, the main magnet comprises a third cavity and a fourth magnet segment. The fourth magnet segment is arranged in the third cavity of the main magnet and configured to be variably positioned and/or oriented relative to the first magnet segment for adjusting a magnetic field contribution of the fourth magnet segment to the main magnetic field.

The third cavity and/or the fourth magnet segment may be embodied according to an aspect of the cavity and/or the second magnet segment described above.

In one aspect, the third cavity and the fourth magnet segment form a continuation or extension of the second cavity and the third magnet segment, interrupted or separated by a section of the cavity and the second magnet segment. For example, the third magnet segment and the fourth magnet segment may be understood as one magnet subdivided into two separate magnet segments configured to be moved and/or rotated at a same rate and/or speed.

In providing a third cavity and a fourth magnet segment, a spatial encoding of magnetic resonance signals and/or diffusion information may favourably be improved. Particularly, a higher magnetic gradient field variation may be obtained, thus favourably enriching diffusion information in the acquired magnetic resonance data.

According to an aspect, the inventive magnetic resonance device further comprises a gradient system including at least one gradient coil configured for providing a gradient magnetic field superimposing the main magnetic field.

A gradient coil may be configured for generating a magnetic gradient field in the imaging region provided by the main magnet. Preferably, a main direction of magnetic field lines of the magnetic field provided via the at least one gradient coil is oriented substantially perpendicular to a main direction of magnetic field lines of the magnetic field provided via the first magnet segment and/or the second magnet segment.

The at least one gradient coil may comprise one or more resistive wires.

In one aspect, a wire pattern of the at least one gradient coil may follow a contour of the at least one surface of the main magnet.

In a preferred aspect, the gradient system comprises at least a first gradient coil and a second gradient coil. The first gradient coil may be configured to generate a first magnetic gradient field and the second gradient coil may be configured to generate a second magnetic gradient field in the imaging region. The first magnetic gradient field may be oriented essentially perpendicular to the second magnetic gradient field.

In a further aspect, one or more gradient coils may be configured and/or arranged to enhance or modify a magnetic field gradient provided via movement of the second magnet segment, but also to create a more homogeneous magnetic field of the main magnet.

The gradient system may further comprise a third gradient coil configured to generate a third magnetic gradient field within the imaging region. It is conceivable, that the third magnetic gradient field is oriented substantially perpendicular to the first magnetic gradient field and the second magnetic gradient field.

According to the disclosure, a shape of the at least one gradient coil matches a shape of the main magnet, particularly a shape of the at least one surface. For example, the shape of the at least one gradient coil may correspond to a shape of the at least one surface, particularly the recess of the at least one surface.

In providing a disclosed magnetic resonance device including a gradient system, spatial encoding of magnetic resonance signals may favourably be provided in multiple spatial directions.

The inventive magnetic resonance system comprises a magnetic resonance device according to an aspect described above, a control unit and a positioning unit. The positioning unit is mechanically connected to the second magnet segment and configured for variably adjusting a position and/or an orientation of the second magnet segment relative to the first magnet segment. The control unit is configured for controlling the positioning unit to variably adjust a position and/or orientation of the second magnet segment relative to the first magnet segment.

The magnetic resonance system may comprise all components usually required for operating a magnetic resonance device and/or performing a magnetic resonance measurement. For example, the magnetic resonance system may comprise a cooling system, a cryocooler, a patient positioning system, a processing unit, a control unit, a storage unit, an operating panel, a monitor or output unit, and the like.

The positioning unit may comprise an actuator and/or a drive assembly configured for moving, particularly rotating, the second magnet segment. The actuator and/or drive assembly may be controlled by an electric signal, such as an electric voltage or an electric current, but also a pneumatic or hydraulic fluid pressure. In a preferred aspect, the positioning unit comprises a shaft or other rotating machine element configured for transmitting power to the second magnet segment. In particular, the shaft may be configured to move or rotate the second magnet segment relative to the first magnet segment. The positioning unit may further comprise a motor configured for transmitting power to the shaft in dependence of a control signal provided by the control unit.

The control unit may be configured to control the positioning unit to adjust a position and/or angular position of the second magnet segment. For this purpose, the control unit may be configured to provide a control signal, such as an electrical voltage, an electrical current, an optical signal, or the like. The signal provided by the control unit may be directly received by the positioning unit via a suitable signal connection. However, the control unit may also be configured to control secondary components, such as a valve, a pump and/or a compressor configured for generating a pneumatic or hydraulic pressure driving the positioning unit.

The control unit may be connected to a main control unit of the magnetic resonance device. However, the control unit may also form an independent or stand-alone component. Preferably, the control unit and the main control unit of the magnetic resonance device are connected via a signal connection. Thus, a rate, a speed, and/or timing of a movement of the second magnet segment may be adjusted in dependence of a magnetic resonance measurement, particularly an imaging sequence.

The positioning unit may be structurally and/or mechanically integrated within the magnetic resonance device. However, the positioning unit may also be implemented as a stand-alone unit. For example, the positioning unit may be configured to reversibly connect to the second magnet second via suitable mechanical connection.

In providing a disclosed magnetic resonance system, a motion of the second magnet segment may favourably be adjusted in dependence of a magnetic resonance measurement, particularly an imaging sequence, to be performed.

The inventive magnetic resonance system shares the advantages of the inventive magnetic resonance device according to an aspect described above.

According to an aspect, the inventive magnetic resonance system comprises a second positioning unit configured for variably adjusting a position and/or an orientation of the third magnet segment relative to the first magnet segment. The control unit is configured for controlling the second positioning unit to variably adjust a position and/or orientation of the third magnet segment relative to the first magnet segment.

The second positioning unit may be implemented according to an aspect of the positioning unit described above.

In a preferred aspect, an actuator, motor and/or drive assembly of the second positioning unit is separated from the actuator, motor and/or drive assembly of the positioning unit. Thus, the second magnet segment and the third magnet segment may be moved and/or rotated independently of one another and/or relative to each other.

In providing separate drives for the positioning unit and the second positioning unit, a higher degree of freedom regarding spatial encoding and/or diffusion imaging may be obtained. Particularly, a higher magnetic gradient field variation may be obtained, thus favourably enriching information in the acquired magnetic resonance data.

However, it is also conceivable that the actuator, motor and/or drive assemblies of the positioning unit and the second positioning unit are mechanically connected to provide synchronous motion and/or rotation of the second magnet segment and the third magnet segment. In one aspect, the second positioning unit may correspond to the positioning unit.

According to a further aspect of the magnetic resonance system, the control unit is configured for simultaneously controlling the positioning unit and the second positioning unit to variably adjust the position and/or an orientation of the second magnet and the third magnet segment relative to the first magnet segment.

The control unit may be configured to control both the positioning unit and the second positioning unit simultaneously and/or individually. For example, the control unit may be configured the control the positioning unit to variably move or rotate the second magnet at a first point in time and control the second positioning unit to variably move or rotate the third magnet at a second point in time. The first point in time may differ from the second point in time. However, the first point in time and the second point in time may also coincide.

The control unit may be subdivided into at least a first instance and a second instance, wherein the first instance is configured to control the positioning unit and the second instance is configured to control the second positioning unit.

According to a further aspect of the magnetic resonance system, the control unit is configured for simultaneously controlling the positioning unit and the second positioning unit to variably adjust the position and/or an orientation of the second magnet and the third magnet segment relative to the first magnet segment at different rates and/or different speeds.

As described above, the positioning unit and the second positioning may be separate components configured to variably move and/or rotate the second magnet segment and/or the third magnet segment at different speeds, rates and/or at different points in time, but also synchronously.

However, in case the actuator, motor and/or drive assemblies of the positioning unit and the second positioning unit are mechanically connected, the positioning unit and/or the second positioning unit may comprise a conversion gear configured to adjust a rate, speed and/or excursion of the second magnet segment relative to the third magnet segment or vice versa. Thus, the positioning unit and the second position unit may be controlled synchronously, but still allow for different rates or speeds of motion and/or rotation of the second magnet segment and the third magnet segment.

In mechanically coupling drive assemblies of the positioning unit and the second positioning unit, a particularly compact and/or cost-effective magnetic resonance system may be provided.

According to a preferred aspect of the inventive magnetic resonance system, the control unit is configured for providing diffusion information via adjustment of a position and/or an orientation of the second magnet segment and/or the third magnet segment relative to the first magnet segment.

The diffusion information may be any information used for diffusion-weighted imaging. Particularly, the diffusion information may be provided via generation of magnetic gradient fields (i. e. local variances in the magnetic field) due to motion of the second magnet segment, the third magnet segment and/or the fourth magnet segment relative to the first magnet segment, but also relative to one another.

In one example, variably moving and/or rotating the second magnet segment causes a first local variance (or local gradient) in the magnetic field of the main magnet.

In a further example, variably moving and/or rotating the third magnet segment causes a second local variance (or gradient) in the magnetic field of the main magnet.

The first local variance and/or the second local variance in the magnetic field may be known or predictable.

In one aspect, the first magnet segment and the second magnet segment may be positioned and/or rotated simultaneously or independently. The local variance of the magnetic field of the main magnet may be significantly increased, when both the first magnet segment and the second magnet segment are rotated and/or moved at the same time. Particularly, the first local variance and the second local variance may superimpose in the magnetic field, preferably the imaging volume, of the main magnet.

A first rotation of the second magnet segment producing the first local variance in the magnetic field may effectively tag phases of molecules (i. e. water molecules) according to their spatial positions. A second rotation of a third magnet segment producing the second local variance in the magnetic field may at least partially cancel out or amplify such tags in an anticipated predicted manner if the positions of the molecules do not change.

In the presence of diffusion or flow, molecules move during a predefined time interval, thus causing a deviation from an anticipated cancellation or amplification of said tags. This deviation may be used as diffusion information for diffusion-weighted imaging.

In a simple example, motion of the molecules may lead to overall dephasing when integrating the phase of the molecules over a spin ensemble, which may result in an attenuation of magnetic resonance signal (diffusion-weighted signal decay).

However, the rotation of one or more magnet segments may provide a plurality of anticipated attenuation and/or amplification patterns from which diffusion information can be derived. The anticipated attenuation or amplification patterns may depend on the motion, particularly the angular orientation, of the first magnet segment and/or the second magnet segment.

Due to significant local variances in the magnetic field provided via the main magnet, spins can already introduce relevant phase differences when passing shorter distances in the magnetic field as compared to conventional magnetic resonance systems. Thus, the inventive magnetic resonance imaging system may favourably provide a particularly space-efficient solution for generating magnetic field variations for diffusion-weighted imaging.

According to a further aspect of the inventive magnet resonance system, the at least one gradient coil is arranged in such a way that a gradient magnetic field provided via the at least one gradient coil contributes to the diffusion information obtained via adjustment of a position and/or an orientation of the second magnet segment and/or the third magnet segment relative to the first magnet segment.

The inventive magnetic resonance system shares the advantages of the inventive magnetic resonance device according to an aspect described above.

In providing a disclosed magnetic resonance system, encoding of position-dependent information and/or acquisition of diffusion information may favourably be conducted in a robust and reproducible manner.

BRIEF DESCRIPTION OF THE DRAWINGS

Further advantages and details of the present disclosure may be recognized from the aspects described below as well as the drawings. The figures show.

DETAILED DESCRIPTION

Figure 1:
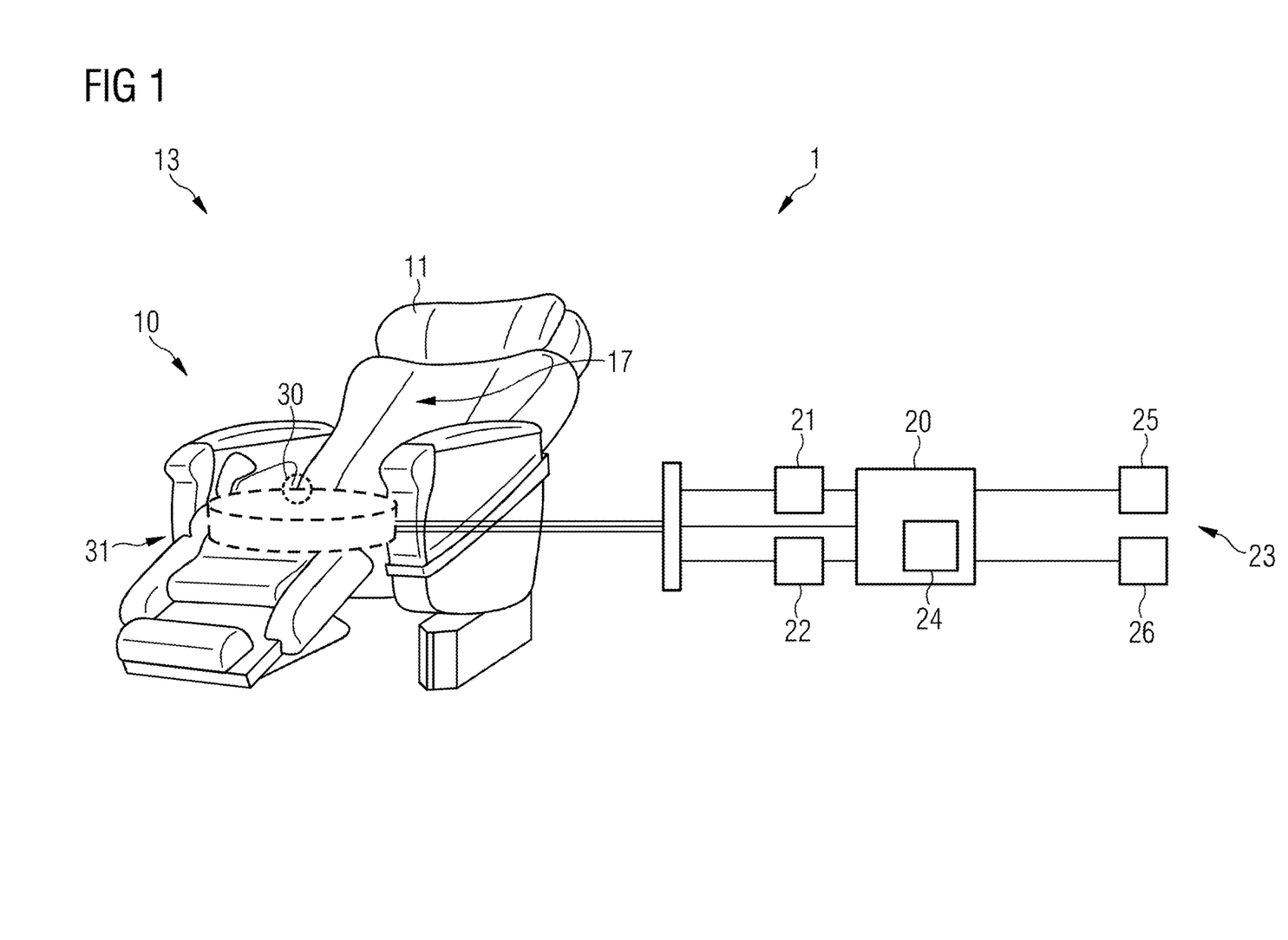
FIG. 1 a schematic representation of an aspect of a magnetic resonance system in accordance with aspects of the disclosure, FIG. 2 a schematic representation of an aspect of a magnetic resonance device in accordance with aspects of the disclosure, FIG. 3 a schematic representation of an aspect of a magnetic resonance device in accordance with aspects of the disclosure, FIG. 4 a schematic representation of an aspect of a magnetic resonance device in accordance with aspects of the disclosure, FIG. 5 a schematic representation of an aspect of a magnetic resonance device in accordance with aspects of the disclosure, FIG. 6 a schematic representation of an aspect of a magnetic resonance device in accordance with aspects of the disclosure, and FIG. 7 a schematic representation of an aspect of a magnetic resonance device in accordance with aspects of the disclosure.

FIG. 1 depicts a schematic representation of a disclosed magnetic resonance system 1 configured to perform a magnetic resonance measurement of an object. In the depicted aspect, the magnetic resonance device 10 is formed as a chair or recliner configured for receiving a human patient in a sitting or reclining position. It is conceivable that such a magnetic resonance device 10 is used for acquiring magnetic resonance data from an organ structure in a lower portion of the body, for example a prostate or uterus.

However, the aspect of the magnetic resonance device 10 as a chair or recliner is to be understood as an example. The magnetic resonance device 10 may also be configured for performing cardiac imaging, mammography imaging, neurological imaging, urological imaging, orthopedics imaging, or imaging of other body regions of a patient. The magnetic resonance imaging device 10 may also be configured for performing a magnetic resonance measurement of a body region of an animal, but also inanimate objects, food products, archaeological finds, and the like.

Due to an enhanced openness, the inventive magnetic resonance device 10 may be combined with other medical devices, such as flatbed or C-arm X-ray scanners, ultrasound scanners, therapy devices as well as optical imaging devices. Other imaging modalities may be used to improve results of the magnetic resonance measurement by providing high resolution navigator signals and/or data fusing.

As shown in FIG. 1, the magnetic resonance device 10 comprises a main magnet 31. The main magnet 31 is supported in a chair-like supporting structure 11. The supporting structure 11 may comprise an iron yoke and/or a backing plate covering a surface of the main magnet 31 directed away from the imaging volume 30 (i. e. to form single-sided main magnet 31).

In one aspect, the supporting structure 11 comprises an adjustment mechanism (not shown) configured to modify a position and/or orientation of the main magnet 31. Preferably, the adjustment mechanism is configured for adjusting a relative position and/or orientation of the main magnet 31 with respect to an examination room 13, but also with respect to a patient positioned within the imaging region 17. For example, the adjustment mechanism may comprise a swivel joint configured to rotate the main magnet 31 along one or more axes. The adjustment mechanism may also comprise a telescope system and/or rail system configured for adjusting a position of the main magnet 31 along a Y-direction, an X-direction and/or a Z-direction. Of course, other aspects of the supporting structure 11 and/or the adjustment mechanism are conceivable. In a preferred aspect, the main magnet 31 and/or the supporting structure 11 may be tilted via the adjustment mechanism to improve patient access and comfort.

During a magnetic resonance measurement, the object may be positioned within an imaging region 17 comprising the imaging volume 30. The imaging volume 30 may be a field of view of the magnetic resonance device 10. A field of view may be characterized by a volume, from which magnetic resonance data can be acquired via a magnetic resonance measurement. The imaging volume 30 may also comprise an isocentre. In the depicted aspect, the imaging region 17 is formed substantially by a seating area provided by the supporting structure 11.

The main magnet 31 may be configured to generate a static magnetic field in the imaging region 17. The magnetic resonance device 10 may further comprise a gradient system with at least one gradient coil (not shown) for generating a magnetic gradient field used for spatial encoding of magnetic resonance signals acquired during a magnetic resonance measurement.

Preferably, the magnetic resonance device 10 further comprises a radiofrequency system with at least one radiofrequency antenna (not shown) configured to emit a radiofrequency excitation pulse into the imaging region 17. The at least one radiofrequency antenna may also be configured for receiving magnetic resonance signals from the imaging region 17, particularly the imaging volume 30. In one aspect, the at least one radiofrequency antenna may be configured as a local coil.

The magnetic resonance device 10 comprises a control unit 20 configured to control the magnetic resonance device 10 to perform a magnetic resonance measurement. The control unit 20 may comprise a signal connection with a gradient control unit 21 and a radiofrequency antenna control unit 22. It is also conceivable, that the gradient control unit 21 and the radiofrequency antenna control unit 22 are integrated within the control unit 20. Furthermore, the control unit 20 may comprise a processing unit 24 configured to coordinate an acquisition of magnetic resonance data and/or a reconstruction of magnetic resonance data acquired from an object in the imaging region 17. It is conceivable, that the processing unit 24 is also configured to evaluate and/or process data, such as magnetic resonance signals, magnetic resonance data and/or magnetic resonance image data. The control unit 20 may comprise a controller, a microcontroller, an analog circuit, a logic unit and the like. The processing unit 24 may comprise a processor, such as a CPU, a GPU and the like. It is also conceivable, that the control unit 20 and/or the processing unit 24 comprise a memory and/or an internal storage, such as a RAM, a ROM, a PROM, an EPROM, an EEPROM, a flash memory, as well as an HDD, an SSD and the like.

Control information, such as imaging parameters and/or magnetic resonance data, can be displayed on an output unit 25. The output unit 25 may comprise at least one monitor or screen configured for displaying control information and/or magnetic resonance data acquired via the magnetic resonance device 10 to an operator of the magnetic resonance device 10. The magnetic resonance device 10 may further comprise an input unit 26 configured to receive information and/or parameters input by the operator for performing a magnetic resonance measurement. Preferably, the output unit 25 and the input unit 26 are part of a user interface 23 configured for controlling and/or monitoring information related to a magnetic resonance measurement.

The illustrated magnetic resonance system 1 may of course include further components that magnetic resonance systems usually comprise. The general mode of operation of a magnetic resonance system is well-known to the skilled person. Thus, a further description of the general components or a sequencing of a magnetic resonance measurement is not deemed necessary.

Figure 2:
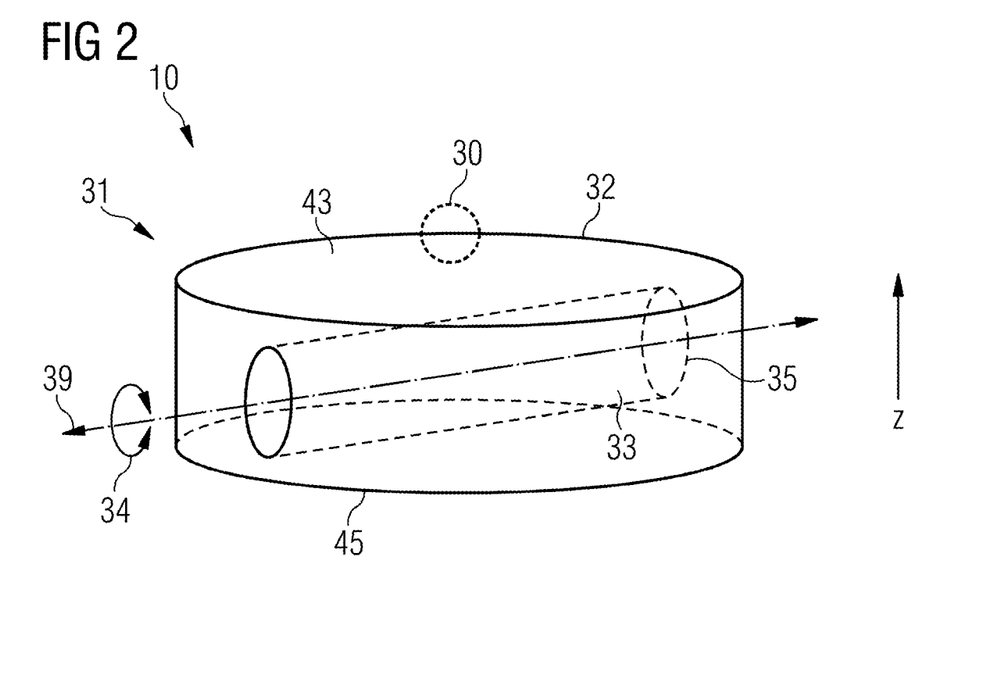

FIG. 2 shows a schematic depiction of the main magnet 31 of the inventive magnetic resonance device 10. The main magnet 31 comprises a first magnet segment 32 and a second magnet segment 33 accommodated within a cylindrical cavity 35. The cavity 35 is formed within the first magnet segment 32. The first magnet segment 32 encompasses the second magnet segment 33 along a circumferential direction.

In the illustrated example, the first magnet segment 32 is shaped as a disc or shallow cylinder. The first magnet segment 32 comprises a cavity 35, e. g. a cylindrical bore. Preferably, an axis of the cavity 35 is oriented in parallel to a surface 43 and/or a surface 45 of the main magnet 31.

In the aspect depicted in FIG. 2, the second magnet segment 33 consists of a cylindrical ferromagnet positioned within the cylindrical bore or cavity 35. Preferably, a magnetization of the second magnet segment 33 is oriented essentially perpendicular to a cylindrical axis and/or an axis of rotational symmetry of the second magnet segment 33 (see FIG. 3).

Figure 4:
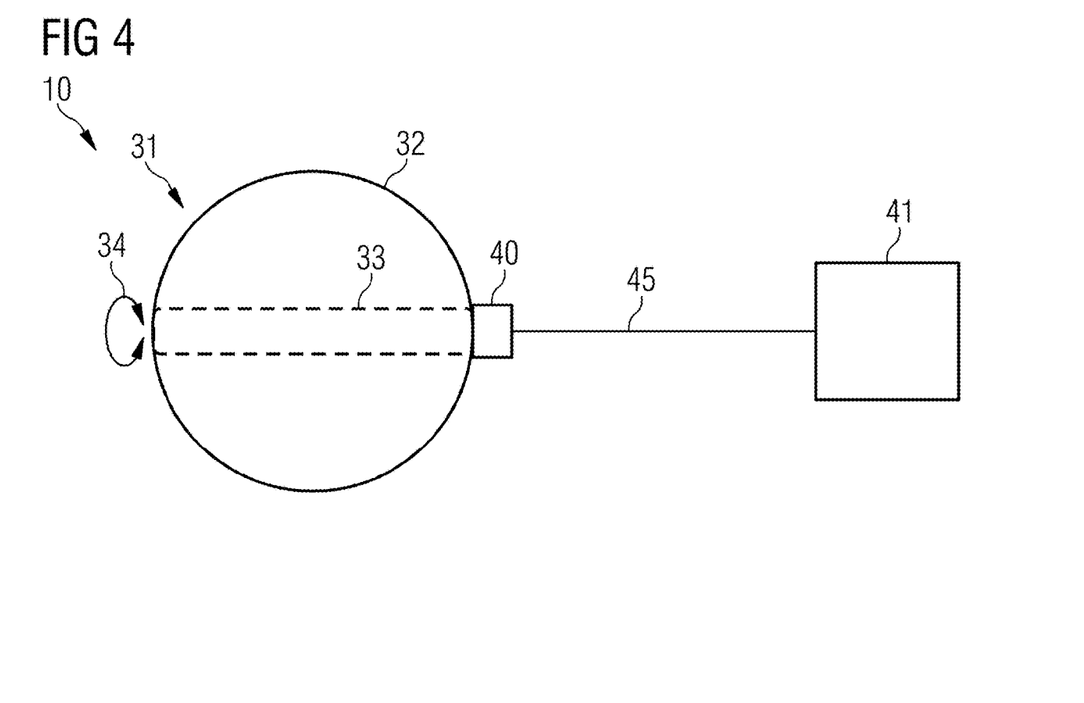

The second magnet segment 33 is configured to be moved along the axial direction 39 and/or rotated along the rotation direction 34 within the cavity 35 by a positioning unit 40 (see FIG. 4). The first magnet segment 32 generates a first magnetic field, whereas the second magnet segment 33 generates a second magnetic field. The first magnetic field and the second magnetic field may superimpose in the imaging volume 30 on the surface 43 of the main magnet 31. Particularly, the first magnetic field and the second magnetic field may form a main magnetic field (not shown). By moving and/or rotating the second magnet segment 33 relative to the first magnet segment 32, a contribution of the second magnetic field to the main magnetic field can be adjusted.

In a preferred aspect, the second magnet segment 33 is formed as a cylindrical permanent magnet with a diameter of 8 cm. A magnetic field strength provided via the main magnet 31 may amount to about 0.05 T, and a typical local gradient may amount to approximately 125 mT/m. However, the main magnet 31 may also be configured to provide a magnet field with a higher or lower magnetic field strength. For example, the main magnet 31 may be configured to provide a magnetic field with a magnetic field strength between 0.01 T and 0.6 T. Preferably, the main magnet 31 is configured to provide a magnetic field strength between 0.01 and 0.1 T.

In one aspect, the main magnet 31 as depicted in FIG. 2 may be configured as a single-sided magnet. For example, the surface 45 may be covered by a shield (not shown)

configured for deflecting the magnetic field provided by the main magnet 31 towards the surface 43. The single-sided main magnet 31 may provide a magnetic field with a static magnetic gradient field in the Z-direction and have a symmetry according to the geometry of the main magnet 31 (i. e. a cylindrical geometry in case of a cylindrical main magnet). The static magnetic gradient field in the Z-direction can be exploited for spatial encoding, e. g. for a generalized "slice" selection. Particularly, the generalized "slice" may comprise a curved surface like a paraboloid.

Figure 3:
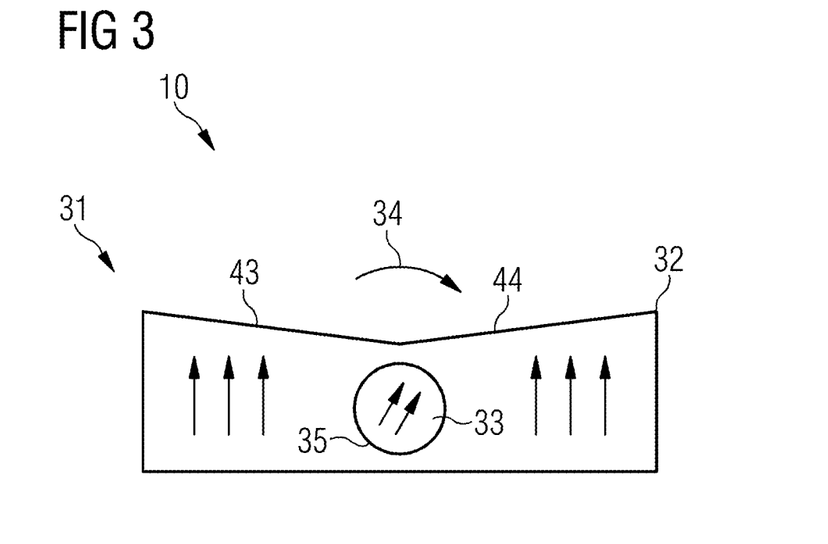

FIG. 3 shows a sectional view of the main magnet 31 of a disclosed magnetic resonance device 10. In the depicted example, the surface 43 of the main magnet 31 comprises a recess 44. The recess 44 may be shaped in correspondence with an outer contour of an object to be imaged. Particularly, the recess 44 may be shaped in such a way to conform to a body region of a patient, for example an extremity, an anterior region, a posterior region, and/or a pelvic region. In the depicted example, the recess 44 comprises a V-shape in a cross-section. It is also conceivable that the recess 44 comprises a U-shape or a C-shape in a cross-section.

The second magnet segment 33 is rotatably mounted in the cavity 35 of the main magnet 31 in such a way, that an angular orientation or position of the second magnet segment 33 is adjustable with respect to the first magnet segment 32. In the depicted aspect, the first magnet segment 32 and the second magnet segment 33 consist of permanent magnets. A direction of magnetization of the ferromagnetic material of the first magnet segment 32 and the second magnet segment 33 is indicated by the arrows. When the second magnet segment 33 is turned or rotated from a first angular orientation to a second angular orientation along the rotation direction 34, the direction of the second magnetic field is changed relative to the direction of the first magnetic field. Thus, the direction of the magnetic field of the second magnet segment 33 through the body of the second magnet segment 33 may differ from the direction of the magnetic field of the first magnet segment 32 through the body of the first magnet segment 32 depending on the angular orientation of the second magnet segment 33.

When the second magnet segment 33 is rotated or positioned relative to the first magnet segment 32, magnetic field vector components oriented at a non-zero angle with respect to a main direction of the magnetic field provided by first magnet segment 32 may be created, while an initial magnetic field contribution (i. e. oriented perpendicular to the surface 45) may decrease or even inverse with progressing rotation. Thus, magnetic gradients in two magnetic field vector components may be created.

In case the first magnet segment 32 and the second magnet segment 33 consist of permanent magnets or ferromagnets, the second magnet segment 33 may be diametrically magnetized, whereas the first magnet segment 32 may be axially magnetized. However, the first magnet segment 32 and/or the second magnet segment 33 may also comprise or consist of an electromagnet or a superconducting magnet (not shown).

It is conceivable that moving and/or rotating the second magnet segment 33 does not result in a uniform change of the whole magnetic field but in local magnetic field variations. However, spatial magnetic field distributions and local magnetic gradient distributions may be determined for each position and/or rotational angle of the second magnet segment 33 (or further magnet segments 36, 37, 38) and used for subsequent analysis of acquired magnetic resonance data. For example, regions of constant gradient amplitude of a Bz component may consist of bent 2-dimensional surfaces which change during the rotation of the second magnet segment 33.

FIG. 4 shows an aspect of the inventive magnetic resonance device 10, wherein the second magnet segment 33 is mechanically connected to a positioning unit 40. The positioning unit 40 is configured for variably adjusting a position and/or an orientation, particularly an angular orientation, of the second magnet segment 33 relative to the first magnet segment 32.

The positioning unit 40 is controlled via the control unit 41. The control unit 41 may be implemented as a part of the control unit 20 or represent an independent component. Preferably, the control unit 41 is connected to the positioning unit 40 via a signal connection 45. The signal connection 45 may be formed as an electrical connection, an optical connection, but also a fluid connection. The control unit 41 may be configured to control a drive assembly or motor (not shown) of the positioning unit 40. However, the control unit 40 may also control a valve, a pump, and/or a compressor configured for adjusting a force exerted on the positioning unit 40 via a pneumatic or hydraulic fluid.

Figure 5:
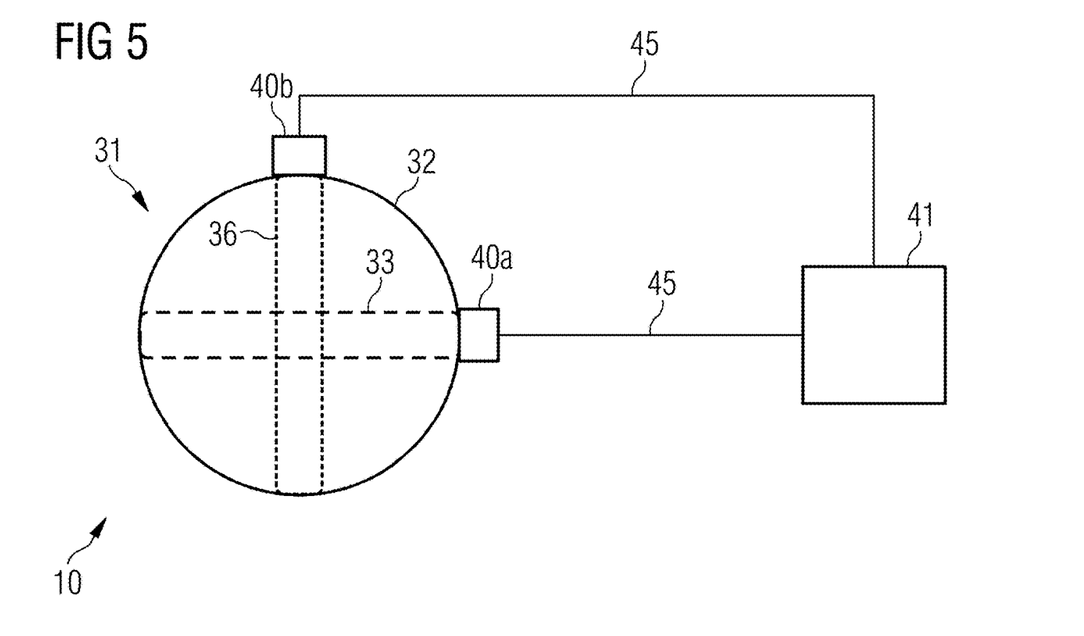

FIG. 5 shows an aspect, wherein the inventive magnetic resonance device 10 comprises a first magnet segment 32, a second magnet segment 33 and a third magnet segment 36. In the depicted aspect, the second magnet segment 33 and the third magnet segment 36 are arranged along different planes within the first magnet segment 32 to avoid an intersection between the second magnet segment 33 and the third magnet segment 36.

The second magnet segment 33 and the third magnet segment 36 may be connected to the positioning units 40*a* and 40*b*. The control unit 41 may be configured to control the positioning units 40*a* and 40*b* synchronously or individually. It is also conceivable that the positioning units 40*a* and 40*b* are controlled via two separate control units 41*a* and 41*b* (not shown) or separate instances of the control unit 41.

Figure 6:
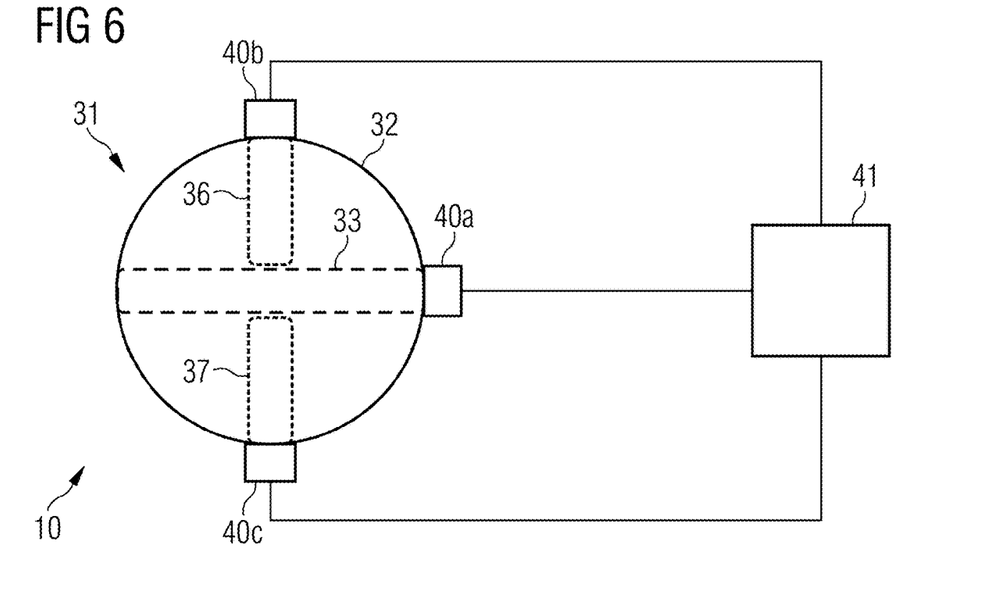

FIG. 6 shows an aspect, wherein the inventive magnetic resonance device 10 comprises a first magnet segment 32, a second magnet segment 33, a third magnet segment 36 and a fourth magnet segment 37.

Preferably, the third magnet segment 36 and the fourth magnet segment 37 are aligned along a common axis. Particularly, the axes of rotational symmetry of the first magnet segment 32, the second magnet segment 33, the third magnet segment 36 and the fourth magnet segment 37 may intersect.

In one aspect, the third magnet segment 36 and the fourth magnet segment 37 may act in union as one magnet segment. The third magnet segment 36 and the fourth magnet segment 37 may be spaced apart to allow for the second magnet segment to pass through a space between the third magnet segment 36 and the fourth magnet segment 37.

The second magnet segment 33, the third magnet segment 36 and the fourth magnet segment 37 may be connected to positioning units 40*a*, 40*b* and 40*c*. The control unit 41 may be configured for controlling the positioning units 40*a*, 40*b* and 40*c* independently or synchronously according to an aspect described above. Preferably, the control unit 41 is configured for controlling the positioning units 40*b* and 40*c* synchronously.

In one aspect, the third magnet segment 36 and the fourth magnet segment 37 are operated synchronously as a combined magnet segment. The second magnet segment 33 and the combined magnet segment may be operated with two different rotational speeds or frequencies. The frequencies may have simple ratios like, for example 4:3, resulting in an overall periodicity. However, the frequency ratio may also be irrational, resulting in no periodicity or a periodicity with very long periods. Richest information, i. e. magnetic gradient variation, may be obtained with a period length in the order of a scan time for the magnetic resonance measurement.

An arrangement with two rotators, such as the second magnet segment 33 and the combined magnet segment, and a first magnet segment 32 providing a fixed magnetic gradient field (i. e. oriented perpendicular to the surface 43 or surface 45) may also be used for spatial reconstruction. For this, the impacts of diffusion and spatial encoding may need to be separated in the evaluation. As a diffusion signal is determined essentially by ∫ G²dt, whereas the spatial information is determined by ∫ G dt, enough variation of the diffusion sensitizing magnetic gradient G(t) for repeated measurements may allow for a separation of both contributions.

Figure 7:
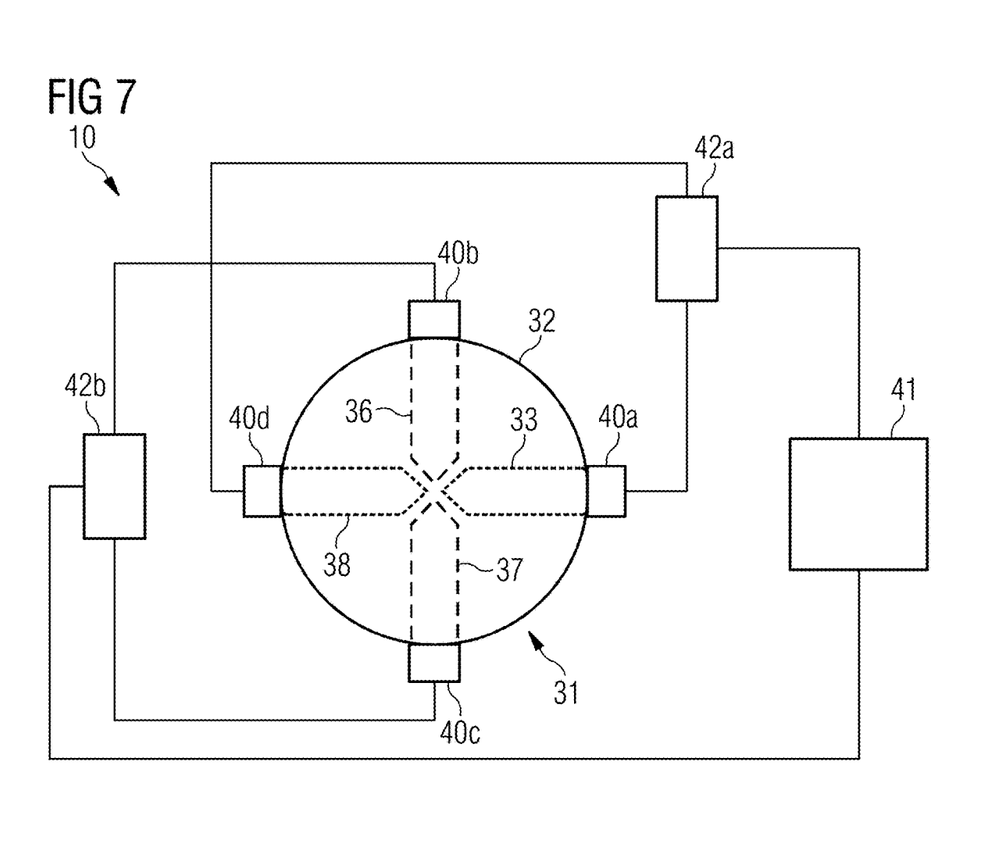

FIG. 7 shows an aspect, wherein the inventive magnetic resonance device 10 comprises a first magnet segment 32, a second magnet segment 33, a third magnet segment 36, a fourth magnet segment 37 and a fifth magnet segment 38. The second magnet segment 33 and the fifth magnet segment 38 may be accommodated in a cavity 35a, whereas the third magnet segment 36 and the fourth magnet segment 37 may be accommodated in a second cavity 35b (not shown).

In the depicted aspect, the positioning units 40a and 40d of second magnet segment 33 and the fifth magnet segment 38 share a motor or drive assembly 42a. Likewise, the positioning units 40b and 40c of the third magnet segment 36 and the fourth magnet segment 37 share a motor or drive assembly 42b.

The control unit 41 is configured to control the drive assemblies 42a and 42b in such a way that the respective magnet segments, i. e. the second magnet segment 33 and the fifth magnet segment 38 and/or the third magnet segment 36 and the fourth magnet segment 37, are moved or rotated synchronously.

In an alternative aspect, each magnet segment 33, 36, 37 or 38 comprises a dedicated positioning unit 40 which can be controlled via the control unit 41 either individually or synchronously. It is also conceivable that two or more of the magnet segments 33, 36, 37, 38 comprise positioning units 40 connected to a common drive assembly 42.

In the aspect depicted in FIG. 7, the magnet segments 33, 36, 37 and 38 each comprise a cylindrical section and a cone section. The cone sections of the magnet segments 33, 36, 37 and 38 may favourably allow for maximizing a mass and/or volumetric density of magnetic material of the magnet segments 33, 36, 37 and 38 within the cavities 35 and/or 35b.

The aspects described above are to be understood as examples of the inventive magnetic resonance imaging device. It is emphasized that individual aspects may be extended by or combined with features of other aspects if not stated otherwise.

The invention claimed is:

1. A magnetic resonance device for acquiring magnetic resonance data of an object, the magnetic resonance device including a main magnet operable to provide a main magnetic field along at least one surface of the main magnet, wherein the main magnet comprises:
   a first magnet segment;
   a second magnet segment; and
   a cavity to accommodate the second magnet segment,
   wherein the second magnet segment is arranged in the cavity of the main magnet, and wherein the second magnet segment is configured to be variably positioned and/or oriented relative to the first magnet segment during a magnetic resonance measurement to adjust a magnetic field contribution of the second magnet segment to the main magnetic field.

2. A magnetic resonance system, comprising:
   a magnetic resonance device for acquiring magnetic resonance data of an object, the magnetic resonance device including a main magnet operable to provide a main magnetic field along at least one surface of the main magnet, wherein the main magnet comprises:
   a first magnet segment;
   a second magnet segment; and
   a cavity to accommodate the second magnet segment,
   wherein the second magnet segment is arranged in the cavity of the main magnet and wherein the second magnet segment is variably positioned and/or oriented relative to the first magnet segment to adjust a magnetic field contribution of the second magnet segment to the main magnetic field, and
   wherein the main magnet comprises a second cavity and a third magnet segment, and wherein the third magnet segment is arranged in the second cavity to be variably positioned and/or oriented relative to the first magnet segment to adjust a magnetic field contribution of the third magnet segment to the main magnetic field;
   a control unit;
   a first positioning unit,
   wherein the first positioning unit is mechanically connected to the second magnet segment and operable to variably adjust a position and/or an orientation of the second magnet segment relative to the first magnet segment, and the control unit is operable to control the first positioning unit to variably adjust a position and/or orientation of the second magnet segment relative to the first magnet segment; and
   a second positioning unit operable to variably adjust a position and/or an orientation of the third magnet segment relative to the first magnet segment,
   wherein the control unit is operable to control the second positioning unit to variably adjust a position and/or orientation of the third magnet segment relative to the first magnet segment.

3. The magnetic resonance device according to claim 1, wherein an inner contour of the cavity of the main magnet essentially corresponds to an outer contour of the second magnet segment.

4. The magnetic resonance device according to claim 1, wherein the main magnet is a single-sided magnet.

5. The magnetic resonance device according to claim 1, wherein the at least one surface of the main magnet comprises a recess, and wherein a contour of the recess is shaped in conformity with an outer contour of an imaging object.

6. The magnetic resonance device according to claim 1, wherein the main magnet comprises a second cavity and a third magnet segment, and wherein the third magnet segment is arranged in the second cavity to be variably positioned and/or oriented relative to the first magnet segment to adjust a magnetic field contribution of the third magnet segment to the main magnetic field.

7. The magnetic resonance device according to claim 1, wherein the main magnet comprises a third cavity and a fourth magnet segment, and wherein the fourth magnet segment is arranged in the third cavity of the main magnet to be variably positioned or oriented relative to the first magnet segment to adjust a magnetic field contribution of the fourth magnet segment to the main magnetic field.

8. The magnetic resonance device according to claim 1, further comprising:
a gradient system including at least one gradient coil operable to provide a gradient magnetic field superimposing the main magnetic field,
wherein a shape of the at least one gradient coil matches a shape of the at least one surface of the main magnet.

9. A magnetic resonance system, comprising:
a magnetic resonance device according to claim 1;
a control unit; and
a positioning unit,
wherein the positioning unit is mechanically connected to the second magnet segment and operable to variably adjust a position and/or an orientation of the second magnet segment relative to the first magnet segment, and the control unit is operable to control the positioning unit to variably adjust a position and/or orientation of the second magnet segment relative to the first magnet segment.

10. The magnetic resonance system according to claim 2, wherein the control unit is operable to simultaneously control the first positioning unit and the second positioning unit to variably adjust the position and/or an orientation of the second magnet segment and the third magnet segment relative to the first magnet segment.

11. The magnetic resonance system according to claim 2, wherein the control unit is operable to provide diffusion information via adjustment of a position and/or an orientation of the second magnet segment and/or the third magnet segment relative to the first magnet segment.

12. The magnetic resonance device according to claim 3, wherein a body of the second magnet segment is rotationally symmetric,
wherein the second magnet segment comprises a ferromagnetic material, and a magnetization of the ferromagnetic material of the second magnet segment is oriented essentially perpendicular to an axis of rotational symmetry of the second magnet segment.

13. The magnetic resonance system according to claim 10, wherein the control unit is operable to simultaneously control the positioning unit and the second positioning unit to variably adjust the position and/or an orientation of the second magnet segment and the third magnet segment relative to the first magnet segment at different rates and/or different speeds.

14. The magnetic resonance system according to claim 11, further comprising:
a gradient system including at least one gradient coil operable to provide a gradient magnetic field superimposing the main magnetic field,
wherein a shape of the at least one gradient coil matches a shape of the at least one surface of the main magnet, and
wherein the at least one gradient coil is arranged in such a way that a gradient magnetic field provided via the at least one gradient coil contributes to the diffusion information obtained via adjustment of a position and/or an orientation of the second magnet segment and/or the third magnet segment relative to the first magnet segment.

15. The magnetic resonance device according to claim 3, wherein the cavity of the first magnet segment and the second magnet segment comprise a three-dimensional cylindrical or conical shape.

16. The magnetic resonance device according to claim 12, wherein the second magnet segment is rotatably mounted in the cavity of the main magnet in such a way, that an angular orientation of the second magnet segment is adjustable with respect to the first magnet segment, wherein:
in a first angular orientation of the second magnet segment, the direction of the magnetic field of the second magnet segment through the body of the second magnet segment is oriented in parallel to a direction of a magnetic field of the first magnet segment through a body of the first magnet, and
wherein in a second angular orientation of the second magnet segment, the direction of the magnetic field of the second magnet segment through the body of the second magnet segment differs from the direction of the magnetic field of the first magnet segment through the body of the first magnet segment.

* * * * *